(12) United States Patent
Machida

(10) Patent No.: US 6,380,739 B1
(45) Date of Patent: Apr. 30, 2002

(54) MULTI-ECHO SEQUENCE BASED MR IMAGING FOR FLUID IN MOTION

(75) Inventor: Yoshio Machida, Nasu-Gun (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/480,159

(22) Filed: Jan. 10, 2000

(30) Foreign Application Priority Data

Jan. 11, 1999 (JP) ............................................. 11-004734

(51) Int. Cl.$^7$ ................................................. G01V 3/00
(52) U.S. Cl. ........................................ 324/309; 324/307
(58) Field of Search ................................ 324/309, 310, 324/312, 307

(56) References Cited

PUBLICATIONS

Hinks et al. "Gradient Moment Nulling in Fast Spin Echo", Magnetic Resonance Medicine; 32: 696–706 (1994).
Miyazaki et al, "A Novel MR Angiography Technique: SPEED Acquisition Using Half–Fourier RARE", J. Magnetic Resonance Imaging 8: 505–507 (1998).
Hennig, "Multiecho Imaging Sequences with Low Refocusing Flip Angles", J. of Magnetic Resonance; 78: 397–407 (1988).
Kaandorp et al, "Three–Dimensional Flow Independent Angiography of Aortic Aneurysms Using Standard Standard Fast Spin Echo", Proc. 6$^{th}$ ISMRM; p. 792 (1998).
Siebert et al, "Flow Phenomena in 3D FSE Black Blood MRA", 5$^{th}$ ISMRM; p. 1844 (1997).
Miyazaki et al, "Fresh Blood Imaging at 0.5–T: Natural Blood Contrast 3D MRA within Single Breathhold", 6$^{th}$ ISMRM; p. 780 (1998).

*Primary Examiner*—Hezron Williams
*Assistant Examiner*—Brij B. Shrivastav
(74) *Attorney, Agent, or Firm*—Nixon & Vanderhye P.C.

(57) ABSTRACT

An FSE-system multi-echo MRI pulse sequence is used to steadily depict objects such as blood flows without a contrast medium. The pulse sequence has a gradient pulse set such that, among the plurality of echoes, an amount M' of a j-th (j=1, 1, 2, . . . ) gradient moment accumulated up to an n-th (n=1, 2, 3, . . . ) echo is approximately half an amount M (considered to be approximately constant when k≧n) of the j-th gradient moment from a k-th (k=n, n+1, n+2, . . . ) echo to a "k+1"-th echo. This pulse sequence is performed and generated multi-echoes are acquired. An MR image is produced using echoes generated after the n-th echo among the acquired multi-echoes. For example, the n-th echo is an echo for n≧2 and a readout gradient to be applied during an interval down to the "n−1"-th echo is altered in time or amplitude, with a given gradient moment.

27 Claims, 12 Drawing Sheets

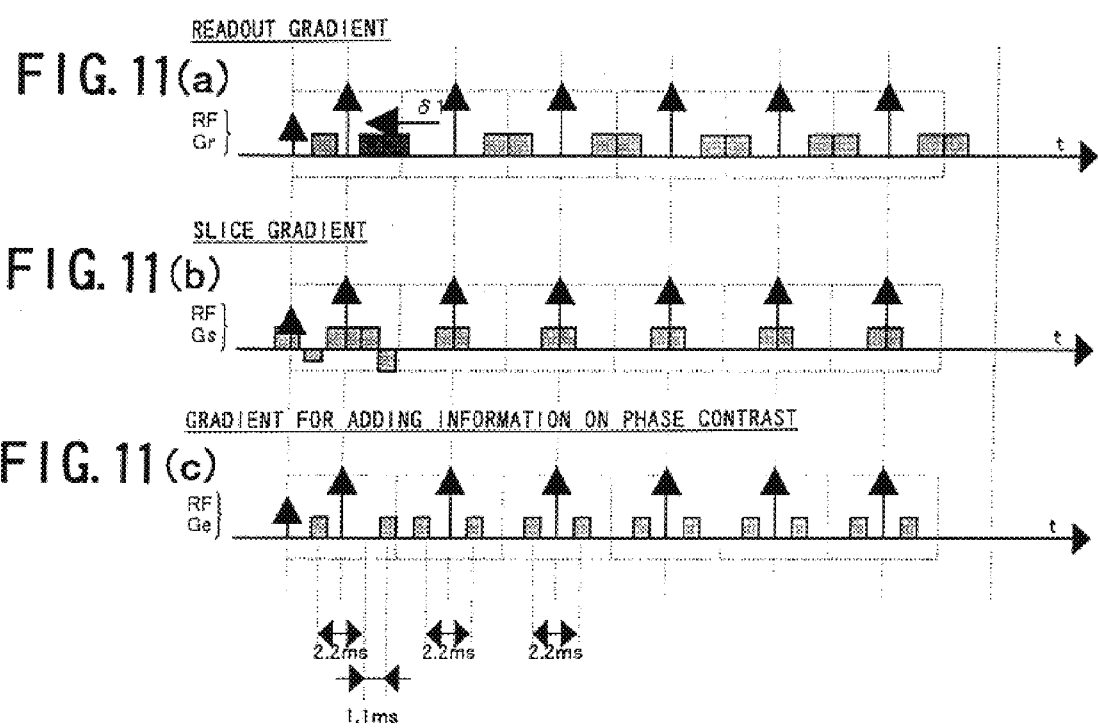

MULTI-ECHO SEQUENCE BASED MR IMAGING FOR FLUID IN MOTION

BACKGROUND OF THE INVENTION

1. Technical Field of the Invention

The present invention relates to medical magnetic resonance imaging (MRI), particularly, imaging to provide images of objects in motion, such as blood, using multi-echo sequences. Specifically, the present invention relates to imaging that uses an FSE (Fast Spin Echo) method or a FASE (Fast Asymmetric SE) method developed therefrom in order to not only image flows of such objects as blood so as to be depicted more steadily but also to depict a distribution of flow velocities with the help of a technique similar to a phase contrast method.

2. Description of Prior Art

Magnetic resonance imaging is based on a technique that magnetically excites nuclear spins of an object placed in a static magnetic field with an RF signal at a Larmor frequency thereof, acquires an MR signal emanated due to the excitation, and reconstructs an image on the basis of the MR signal.

In recent years, as one tomographic imaging technique that is frequently used in the field of MRI, an FSE method is known. The FSE method has a feature of being able to valid influences of the non-uniformity of a static field. Especially, a recent tendency is that echo train spacing (ETS) can be shortened thanks to the development of hardware techniques. Therefore, pulse sequences based on the FSE method that are shorter in echo train spacing or FSE-system pulse sequences developed therefrom are used to have depicted, without contrast mediums, targets in motion, such as blood, that were only tentatively imaged in the past. For example, papers concerning such study are shown by "M. Miyazaki et al., A novel MR angiography technique: SPEED acquisition using half Fourier RARE, JMRI 8: 505–507, 1998," "D W Kaandorp, et al., Three-dimensional Flow Independent Angiography of Aortic Aneurysms using standard Fast Spin Echo, In "proceedings, ISMRM, 67$^{th}$ Annual Meeting" Sydney, Australia, p792, 1998," "M. Miyazaki et al., Fresh Blood Imaging at 0.5-T: Natural Blood Contrast 3D MRA within Single Breathhold, In "Proceedings, ISMRM, 6$^{th}$ Annual Meeting" Sydney, Australia, p780, 1998," and "Y. Kassai et al., 3D Half-Fourier RARE with MTC for Cardiac Imaging, In "Proceedings, ISMRM, 6$^{th}$ Annual Meeting" Sydney, Australia, p806, 1998."

These imaging techniques adopt an ECG gating method by which a delay time from the R-wave is appropriately determined at a cardiac temporal phase representing slower velocities of blood flows passing vessels to be imaged, or a phase-encoding direction, which provides a higher depiction, is adjusted to agree with a conventional blood flow direction of interest.

As another approach for conventional blood flow imaging, a nulling technique for gradient moments has been known to suppress consequences of flows thereof.

However, the foregoing imaging methods are not enough for stable blood flow detection. For example, although the depiction is higher in blood flows along the phase encoding direction, it is reported that blood flows in the readout direction are unable to be depicted. Also reported are artifacts, referred to as "N/2 artifacts," due to the oscillation of signals between the even and odd echoes belonging to multi-echoes. Furthermore, because excessive times for switching gradients are required, the nulling method of gradients is practiced only in cases where flows pass at slower velocities, resulting in a limited versatility.

SUMMARY OF THE INVENTION

The present invention has been performed in consideration of the drawbacks faced by the foregoing conventional MR imaging. One object of the present invention is to use pulse sequences for multi-echoes including FSE-system pulse trains so as to steadily depict objects in motion, such as blood flow, with no contrast medium, providing images of higher reliability in clinics.

Another object is to make it possible to image objects whose flow velocities range is wide regardless of magnitudes of flow velocities.

In order to realize the above objects, the present invention employs an imaging principle and a construction based on principles, which are as follows. In the following explanations, according to necessities, an exciting RF pulse is merely referred to as a "flip pulse" and a refocusing RF pulse as a "flop pulse."

First, the imaging principle will be explained by comparison with conventional techniques.

In the FSE method, when an interval between flip and flop pulses is $\tau$ (i.e., echo train spacing: ETS), it is essential that the first flip-flop interval $\tau'$ be precisely set to be $\tau'=t/2$ and an amount of a gradient pulse applied between flip and flop pulses be precisely half an amount A of gradient pulses to be applied thereafter. Therefore, in cases where a pulse sequence is designed based on the conventional FSE method, as a pulse train to be applied after the flip pulse, the fundamental pulse train of which $\tau'$ and A' are sufficiently adjusted to $\tau'=\tau/2$ and A'=A/2 is repeated.

One example of the FSE-based pulse sequence thus-designed is shown in FIG. 1(b) with its phase diagram shown in FIG. 1(a). This pulse sequence represents only a flip pulse, a plurality of flop pulses and a readout gradient Gr, while slice and phase-encode gradients Gs and Ge are omitted from the drawing.

In the phase diagram shown in FIG. 1(a), its longitudinal axis shows degrees of dephase of magnetic spins and its transverse axis shows time t. Additionally, solid lines extending in oblique directions show the states of transverse magnetization (transverse paths) in which the dephases advance. The transverse dotted lines show the states of longitudinal magnetization (longitudinal paths) which preserve dephase states as the longitudinal magnetization. For the FSE-based pulse sequence that satisfies the foregoing temporal condition $\tau'=\tau/2$ and area condition A'=A2, the states of the transverse and longitudinal magnetization are expressed in a neat condition as shown in FIG. 1(a), resulting in MR images with no artifacts.

Conventionally, for imaging an object in motion using the FSE method, an imaging technique for practicing a flow compensation (FC) method or gradient moment nulling (GMN) method with the foregoing temporal and area conditions satisfied is proposed by "RS. Hinks et al., Gradient Moment Nulling in Fast Spin Echo, MRM 32: 698–706, 1994."

However, in this FSE method cooperatively using the FC and GMN methods, additional gradient pulses are required for the ordinal FSE-basis pulses, resulting in, for example, a prolonged interval between the flip and flop pulses (i.e., the echo train spacing: ETS). Namely, as the time necessary for practicing the pulse sequence per excitation, data acquisition efficiency is degraded, prolonging the entire imaging time. Due to this drawback, it will be difficult to steadily catch an object to be depicted, even when the object, such as blood, flows faster.

Moreover, as described above, the echo train spacing ETS is shortened to, for example, 5 [msec] in order to try to obtain images of blood flow or the heart in motion. In this pulse sequence of which ETS is shortened, there is no room for cooperatively using the FC and GMN methods, because the gradient pulses and RF pulses are tightly arranged along the time axis. If this pulse sequence of which ETS is shortened is used, a higher depiction ability of blood flows along the phase encoding direction is obtained, as described before. However, the depiction ability along the readout direction is poor and "N/2 artifacts" occur because of the oscillation of signals on the even and odd echoes.

The behaviors of signals, which include "N/2 artifacts," obtained on a conventional FSE-basis pulse sequence is now explained with reference to FIG. 2. This example of the signal behaviors, which was simulated with an FSE-basis pulse sequence whose ETS=5 [msec], flop angle FA=150 degrees, and imaging region=35 [cm], show a flow velocity dependency when assuming that the flow velocity of an object is 30 [cm/s]. In this example, as reflecting the consequences of "phase shift effects resulting from motion" due to the readout gradients, the phases and intensities of echo signals are calculated on a phase diagram.

Each data at the upper row in FIG. 2 shows in complex numbers the phases and intensities of loci of signals of the first to thirty-second echoes. These echo signals are Fourier-transformed into real-space reconstructed images, of which data are shown at the lower row in the figure.

From the graphs at the upper row, in the stage of echo signals, there can be seen that 1): as a whole, the phase is shifted relative to the real-part direction as a reference (in cases where an object is at rest, its echo signal is originally oriented in the real-part direction), 2): the signal caused between even echoes and odd echoes oscillates, and 3): the echo signal is shifted in the complex coordinate.

In the real-space data which have undergone Fourier transformation and which are each shown at the lower row in the figure, responsively to the foregoing phenomena 1) to 3), there occur that 1'): the phase is shifted similarly to the echo signal, 2'): in addition to an original image signal, an "N/2" artifact is caused, and 3'): an image signal diminishes (at a flow velocity of v=50 [cm/s], an image disappears).

The upper and lower rows in FIG. 3 show examples of signal behaviors, respectively, in the k-space and real space, which renders the dependency on flop angles and are simulated in the same manner as above (the flow velocity is supposed to be v=15 [cm/s]) as the flop angles are changed. As shown from those graphs, when the flop angle FA is lowered, the signal oscillation caused between the even and odd echoes become more complicated, resulting in that an image is caused to disappear in states of FA=60 degrees or less.

Under such signal behaviors, one large cause that brings about troubles on images, which has been reported so far, results form the signal oscillation described in the above article 2). Thus, FIGS. 4(a)–4(f) explain this signal oscillation, in which an attention is paid to spin echoes, i.e., echo components generated when dephased spins invert in response to the application of an RF pulse.

FIGS. 4(a)–(f) exemplify the behavior of spin echoes according to a pulse sequence in a conventional FSE method. When supposing that the initial phase shift of the first echo (a phase shift produced from the application of a flip pulse to the generation of the first echo) be ø' and a phase shift produced from the k-th echo to the "k+1" echo as for k≧1 be Ø, the conventional sequence provides Ø'≈0.8Ø, whose behaviors are shown in FIGS. 4(a)–(f).

From the stage of FIG. 4(a) where the phase shift has been accumulated up to an initial phase shift ø', the phase shift is inverted to −ø' responsively to the application of the first flop pulse (FIG. 4(b)). Until the application of the second flop pulse, the phase is shifted by an amount of ø to a phase of "ø−ø'" (FIG. 4(c)). The application of the second flop pulse causes the phase to invert to "Å'−ø" (FIG. 4(d)). Again, the phase becomes ø' by phase shifting by an amount of ø during an interval to the application of the third flop pulse (FIG. 4(e)). Hereafter, the similar behaviors are repeated. Therefore, it can be understood that, as shown in FIG. 4(f), the even echoes and odd echoes are oscillated over ø/2 residing therebetween.

In the above explanation, a premise was ø'≈0.8ø, which is able to be derived from a conventional FSE method shown in FIG. 1, where, when ETS=5[ms] is designated, τ'≈1.2+2.0=3.2[ms] and τ≈2.0+2.0=4.0[ms] are established, so that the ratio of those two figures is 3.2:4.0=0.8:1. As for the FSE method, since the ratio of areas of gradient pulses is maintained at a certain relationship, the phase shift is proportional to an amount of "interval between application of gradients x velocity." In this invention, τ' is a temporal difference between one instant at the gravity of a readout gradient waveform applied between the flip and the flop, and another instant at which the gravity of a gradient waveform for producing the first echo is achieved in its portion from the start of its application to the center of an echo. Additionally, τ is a temporal difference between one instant at which the gravity of a readout gradient waveform for producing the k-th echo is achieved in its portion from the center of an echo to the end of its application, and another instant at which the gravity of a gradient waveform for producing the "k+1"-th echo is achieved in its portion from the start of its application to the center of another echo.

The basic principle of imaging of the present invention is to make the foregoing initial phase shift Ø' agree or substantially agree with Ø/2 (the "agreement" used herein means a degree of agreement under which, at least, even a bit of advantages of the present invention can be obtained). The behaviors of echoes when this condition of the phase shift, Ø'=(or ≈) Ø/2 (hereinafter, referred to as a "Ø/2 condition") is met are illustrated in FIGS. 5(a)–(f) with the notation equivalent to the foregoing FIGS. 4(a)–(f). Namely, from the stage of FIG. 5(a) where the phase shift has been accumulated up to an initial phase shift Ø"=Ø/2, the phase shift is inverted to −Ø'=−Ø/2 responsively to the application of the first flop pulse (FIG. 5(b)). Until the application of the second flop pulse, the phase is shifted by an amount of Ø to a phase of "Ø/2" (FIG. 5(c)). The application of the second flop pulse causes the phase to invert to "−Ø/2" (FIG. 5(d)). Again, the phase becomes "Ø/2" by phase shifting by an amount of Ø during an interval to the application of the third flop pulse (FIG. 5(e)). Hereafter, the similar behaviors are repeated. Therefore, it can be understood that, as shown in FIG. 5(f), differently from the conventional method shown in FIG. 4, the echoes become stable at a phase of "Ø/2."

In the foregoing pulse sequence on the conventional FSE method, there existed a restriction in sequence design, as described before, and easy variations are therefore unavailable to the sequence.

Hence, the present invention proposes an imaging technique that uses a pulse sequence capable of overcoming such a drawback.

According to a practical configuration of the present invention, as a first invention, there is provided an MR imaging method comprising the steps of: performing a pulse sequence including an excitation pulse exciting spins of an object to be imaged, a plurality of pulses generating a plurality of echoes by inverting the excited spins a plurality of times, and a gradient pulse set such that a gradient moment to be accumulated before a generation time to be referenced of a given echo selected from the plurality of echoes is substantially half a gradient moment accumulated between echoes generated after the generation time; acquiring the plurality of echoes generated in response to the performance of the pulse sequence; and producing an MR image by using at least part of echoes included in the acquired plurality of echoes and generated after the given echo.

Preferably, the performing step is a step performed with the gradient pulse set such that, among the plurality of echoes, an amount M' of a j-th (j=1, 1, 2, . . . ) gradient moment accumulated up to an n-th (n=1, 2, 3, . . . ) echo is approximately half an amount M (considered to be approximately constant when k≧n) of a j-th gradient moment from a k-th (k=n, n+1, n+2, . . . ) echo to "k+1"-th echo.

For example, the j-th gradient moment is a velocity moment corresponding to j=1. Further, for example, the MR image is produced using all echoes generated after the n-th echo in the plurality of echoes.

Furthermore, for instance, the pulse sequence is a pulse sequence that causes multi-echoes to be generated in response to application of a plurality of refocusing pulses. In this case, by way of example, the j-th gradient moment is a velocity moment corresponding to j=1.

A further example is that, as the multi-echo type of pulse sequence that uses the refocusing pulses, an pulse sequence on a fast SE method that allows all indirect echoes to be included and superposed. For example, the pulse sequence is a single shot type of pulse sequence.

One preferable mode is that the n-th echo of the pulse sequence is an echo for n≧2 and the gradient pulse applied until the "n−1"-th echo in order to set the gradient moment is changed about either one of time and amplitude thereof. In this construction, for example, the gradient pulse is a readout gradient pulse. Still, it is preferred the readout gradient pulse applied at the first echo to the "n−1"-th echo of the pulse sequence on the fast SE method is a gradient pulse applied shifted in time, where the gradient pulse is set to be shifted in a time axis direction such that an amount of the shifted time becomes a desired value with signs given the shifted time in accordance with the number of inversions of a refocusing pulse.

Additionally, the pulse sequence may be a pulse sequence on the basis of a DIET (Dual Interval Echo Train) method. In such a case, the pulse sequence on the DIET method can be a pulse sequence in which gradient moment nulling is performed before and after a refocusing pulse to be applied in a first echo train spacing to be anticipated and the condition for setting the gradient moment is satisfied immediately before a first echo.

Still, the pulse sequence may be a sequence set in an order on a centric order technique where an order of phase encoding applied to the echoes is oriented from a central part in a phase encode direction of a k-space to a peripheral part thereof in the k-space. Further, the pulse sequence may be a pulse sequence on the basis of a partial-Fourier method. Moreover, the pulse sequence can be performed using either one of an electrocardiograph gating technique and a peripheral gating technique. In this case, either one of the electrocardiograph gating technique and the peripheral gating technique is set to perform a delay time control in a manner that the pulse sequence is executed at a temporal phase in which a flow velocity in a blood vessel employed as the object is relatively smaller.

As a second invention, provided is an MR imaging method for obtaining an MR image of an object that flows, by using a multi-echo type of pulse sequence, comprising the steps of: producing the pulse sequence by setting a gradient pulse such that, among the plurality of echoes, an amount M' of a j-th (j=1, 1, 2, . . . ) gradient moment accumulated up to an n-th (n=1, 2, 3, . . . ) echo is approximately half an amount M (considered to be approximately constant when k≧n ) of the j-th gradient moment from a k-th (k=n, n+1, n+2, . . . ) echo to a "k+1"-th echo; and performing the pulse sequence.

Further, as a third invention, provided is an MRI system comprising: means for performing a pulse sequence including an excitation pulse exciting spins of an object to be imaged, a plurality of pulses generating a plurality of echoes by inverting the excited spins a plurality of times, and a gradient pulse set such that a gradient moment to be accumulated before a generation time to be referenced of a given echo selected from the plurality of echoes is substantially half a gradient moment accumulated between echoes generated after the generation time; means for acquiring the plurality of echoes generated in response to the performance of the pulse sequence; and means for producing an MR image by using at least part of echoes included in the acquired plurality of echoes and generated after the given echo. Preferably, the pulse sequence is a pulse sequence in which, among the plurality of echoes, an amount M' of a j-th (j=1, 1, 2, . . . ) gradient moment accumulated up to an n-th (n=1, 2, 3, . . . ) echo is approximately half an amount M (considered to be approximately constant when k≧n) of a j-th gradient moment from a k-th (k=n, n+1, n+2, . . . ) echo to a "k+1"-th echo.

As a fourth invention, there is provided a computer-readable recording medium in which a multi-echo type of pulse sequence for MR imaging is recorded in the form of a program, wherein the pulse sequence is a pulse sequence in which, among the plurality of echoes, an amount M' of a j-th (j=1, 1, 2, . . . ) gradient moment accumulated up to an n-th (n=1, 2, 3, . . . ) echo is approximately half an amount M (considered to be approximately constant when k≧n) of a j-th gradient moment from a k-th (k=n, n+1, n+2, . . . ) echo to a "k+1"-th echo.

Further, as a fifth embodiment, provided is an MR imaging method for obtaining an MR image of an object that flows, by using a multi-echo type of pulse sequence including a plurality of refocusing RF pulses, comprising the steps of: performing, under m-piece (m is plural) gradient moments M (M1, M2, . . . , Mm) to be applied, the pulse sequence set such that, among the plurality of echoes, an amount M' of a j-th (j=1, 1, 2, . . . ) gradient moment accumulated up to an n-th (n=1, 2, 3, . . . ) echo is approximately half an amount M (considered to be approximately constant when k≧n ) of the j-th gradient moment from a k-th (k=n, n+1, n+2, . . . ) echo to a "k+1"-th echo; acquiring the multi-echoes emanated in response to the performance; and imaging j-th information of the object from a plurality of sets of MR data in association with the acquired multi-echoes. As an example, the m-piece gradient moments have an amount representing a difference from a desired gradient moment M0 associated with a phase contrast method. For this case, by way of example, the desired gradient moment M0 is set such that M0=0 to when performing gradient moment nulling.

Additionally, as a sixth invention, provided is an MRI system for obtaining an MR image of an object that flows, by using a multi-echo type of pulse sequence including a plurality of refocusing RF pulses, comprising: means for performing, under m-piece (m is plural) gradient moments M (M1, M2, . . . , Mm) to be applied, the pulse sequence set such that, among the plurality of echoes, an amount M' of a j-th (j=1, 1, 2, . . . ) gradient moment accumulated up to an n-th (n=1, 2, 3, . . . ) echo is approximately half an amount M (considered to be approximately constant when k≧n) of the j-th gradient moment from a k-th (k=n, n+1, n+2, . . . ) echo to a "k+1"-th echo; means for acquiring the multi-echoes emanated in response to the performance; and means for imaging j-th information of the object from a plurality of sets of MR data in association with the acquired multi-echoes.

One example of advantages which are obtained through the performance of a pulse sequence on the FSE method satisfying the "ø/2" condition realized by the above configuration is shown in FIG. 6(b) as the behaviors of echo signals (supposing that an object flows at a velocity of v=30 [cm/s] and an flop angle FA is 150 degrees). In the figure, the upper graph shows the behaviors of echoes in the complex coordinates, while the lower one shows the behaviors of echo signals Fourior-transformed into the real space. For comparison, in a similar way, FIG. 6(a) shows the behaviors of echo signals obtained through the performance of a pulse sequence on the conventional FSE method. As to the phenomena about the problems resulting from the conventional method, it is understood that the oscillations of signals between the even echoes and the odd echoes is largely decreased (refer to the upper graphs in the FIGS. (a) and (b)), leading to a large decrease in the "N/2" artifacts due to the oscillations (refer to the lower graphs in the FIGS. (a) and (b)).

In the foregoing explanation, the behaviors of spins have been expressed by the use of the term "phase shift." By the way, the phase sift is proportional to a product of a gradient moment and flow velocity. If a pulse sequence is given, the gradient moment is constant, with the result that the phase shift is proportional to a flow velocity. For example, if ø=30 degrees at a flow velocity of 10 [cm/s], the phase shift can be exemplified as follows.

| flow velocity | phase shift ϕ | ϕ |
| --- | --- | --- |
| 10 [cm/s] | 15 degrees | 30 degrees |
| 20 [cm/s] | 30 degrees | 60 degrees |
| 30 [cm/s] | 45 degrees | 90 degrees |

The "ø/2" condition is satisfied whatever the flow velocity is. From a physical viewpoint, the term "gradient moment" is correct and should be used instead of the "phase shift" if a strict expression is required, but the term "phase shift" is still effective and can be used as a generous expression. Therefore, the term "phase shift," which is a more concrete concept, is used in the following description.

In the present invention, an imaging technique that meets "ø/2" condition is referred to as a VIPS (Velocity Independent Phase-shift Stabilization) method.

By the way, in this application, as a seventh invention, there is provided an MR imaging method for obtaining an MR image of an object by using a multi-echo type of pulse sequence including a plurality of refocusing RF pulses, wherein a flop angle that the plurality of refocusing pulses provide a magnetization spin is set to be a smaller value of 90 degrees or less. For instance, as the multi-echo type of pulse sequence using the refocusing pulses, a pulse sequence on a fast SE method by which indirect echoes are superposed on the echoes is used.

BRIEF DESCRIPTION OF THE DRAWINGS

In the accompanying drawings:

FIGS. 11(a)–(c) show pulse sequences explaining an application to a phase contrast method of the present invention, according to a second embodiment of the present invention.

DETAILED DESCRIPTION OF PREFERRED EMBODIMENTS

Hereinafter, with reference to the accompanying drawings, the embodiments of the present invention will be described.

Figure 7:
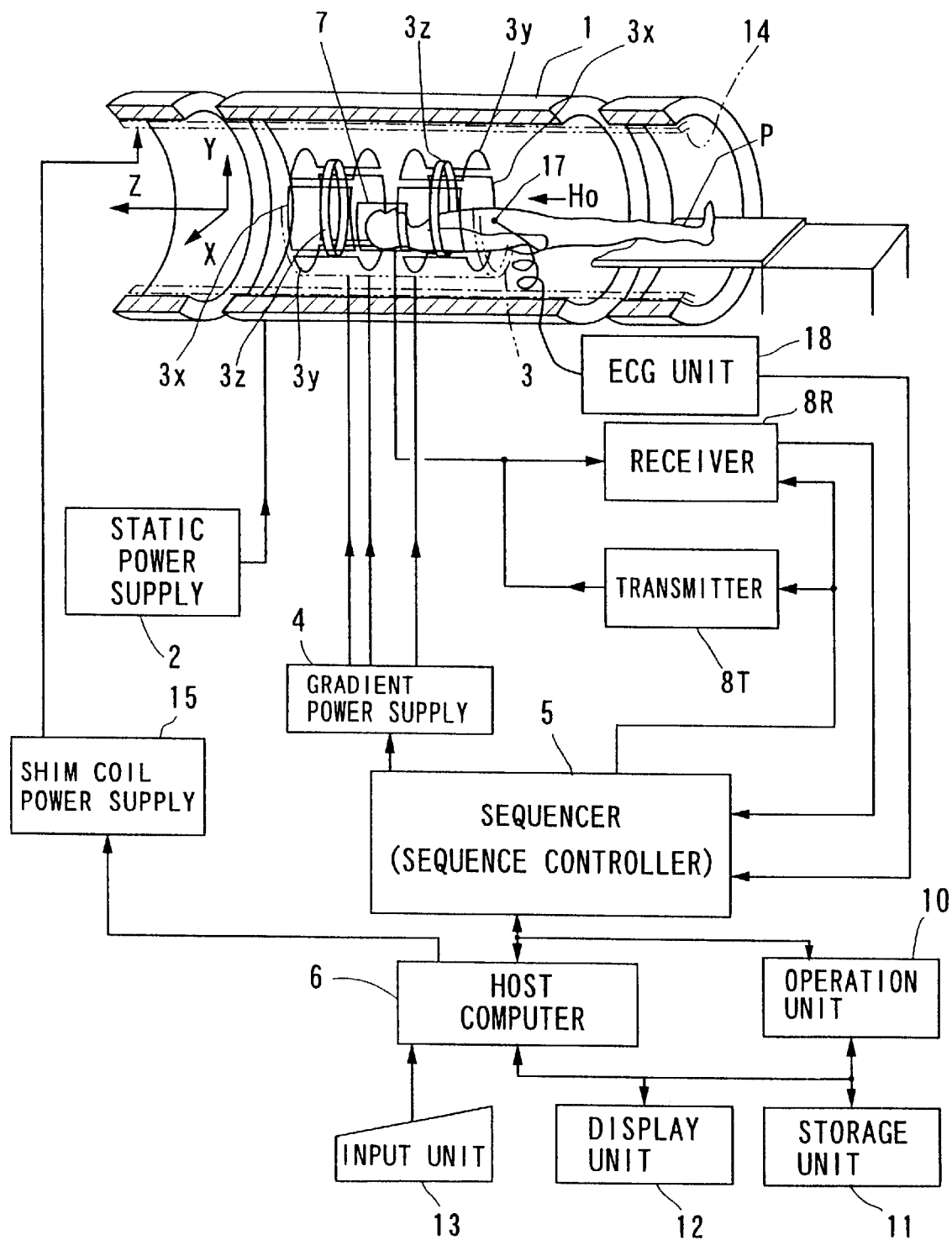
FIG. 7 is a schematic block diagram of an MRI system in accordance with each embodiment of the present invention.

Firstly, an MRI (magnetic resonance imaging) used in common for the following embodiments is outlined in FIG. 7 about its schematic configuration.

The MRI system comprises a patient couch on which a patient P lies down, static magnetic field generating components for generating a static magnetic field, magnetic field gradient generating components for appending positional information to a static magnetic field, transmitting/receiving components for transmitting and receiving a radio-frequency signal, control and arithmetic operation components responsible for control of the whole system and for image reconstruction, and electrocardiographing components for acquiring an ECG signal of a patient, which is a representative of signals indicative of cardiac temporal phases of the patient. In place of the electrocardiographing components, peripheral components measuring the pulse wave of a patient can be placed.

The static magnetic field generating components includes a magnet 1 that is of, for example, a superconducting type, and a static power supply 2 for supplying a current to the magnet 1, and generates a static magnetic field $H_0$ in an axial direction (Z-axis direction) in a cylindrical bore (diagnostic space) into which the patient P is inserted. The magnet unit includes shim coils 14. A current used to homogenize a static magnetic field is supplied from a shim coil power supply 15 to the shim coils 14 under the control of a host computer to be described later. The couch top of the patient couch on which the patient P lies down can be inserted into the bore of the magnet 1 so that the couch top can be withdrawn.

The magnetic field gradient generating components includes a gradient coil unit 3 incorporated in the magnet 1. The gradient coil unit 3 includes three pairs (kinds) of x-, y-, and z-coils 3x to 3z used to generate magnetic field gradients changing in strength in X-axis, Y-axis, and Z-axis directions that are mutually orthogonal. The magnetic field gradient generator further includes a gradient power supply 4 for supplying a current to the x-, y-, and z-coils 3x to 3z. The gradient power supply 4 supplies a pulsating current used to generate a magnetic field gradient to the x-, y-, and z-coils 3x to 3z under the control of a sequencer 5 that will be described later.

The pulsating current supplied from the gradient power supply 4 to the x-, y-, and z-coils 3x to 3z is controlled, whereby magnetic field gradients changing in the three axial directions, that is, the X-, Y-, and Z- physical directions are synthesized. Thus, logic directions in which a slice magnetic field gradient $G_s$, a phase-encoding magnetic field gradient $G_e$, and a readout (frequency-encoding) magnetic field gradient $G_r$ are applied can be specified and changed arbitrarily. The magnetic field gradients to be applied in the slice direction, phase-encoding direction, and readout direction are superposed on the static magnetic field H0.

The transmitting/receiving components includes an RF coil 7 located in the vicinity of a patient P in the scanning space inside the magnet 1, and a transmitter 8T and a receiver 8R connected to the coil 7. Under the control of a sequencer 5 described later, the transmitter 8T and receiver 8R operate. The transmitter 8T supplies to the RF coil 7 RF current pulses with a Larmor frequency, which are used to excite spins to cause nuclear magnetic resonance (NMR). The receiver 8R accepts MR signals (RF signals) that the RF coil 7 has received, carries out various kinds of signal processing, such as pre-amplification, intermediate-frequency conversion, phase detection, lower-frequency amplification, and filtering, with the MR signals, and A/D-converts them to produce digital data (original data) of the MR signals.

Furthermore, the control and arithmetic operation components includes a sequencer 5 (often referred to as a sequence controller), a host computer 6, an arithmetic operation unit 10, a storage unit 11, a display unit 12, and an input unit 13. Among them, the host computer 6 has the function of providing the sequencer 5 information about a pulse sequence and managing the operations of the entire system depending on a variety of modes later described, according to previously installed software programs.

The sequencer 5, which has a CPU and memories, stores pulse sequence information sent from the host computer 6, controls operations performed by the gradient power supply 4, transmitter 8T, and receiver 8R according to the stored information, and temporarily receives digital data corresponding to MR signals outputted from the receiver 8R, before transferring them to the arithmetic operation unit 10. The pulse sequence information includes all information required for operating the gradient power supply 4, transmitter 8T, and receiver 8R according to a series of pulses consisting of a pulse sequence. Such information includes information on the strength, duration, and application timing of pulsed currents applied to the x-, y-, and z-coil 3x to 3z.

The arithmetic operation unit 10 receives digital data (original data) sent from the receiver 8R via the sequencer 5, maps the original data in a Fourier space (known as a k-space) formed in its incorporated memory, and performs a two-dimensional or three-dimensional Fourier transform with the mapped data so as to reconstruct an image in the real space. Moreover, the arithmetic operation unit 10 also carries out such processing as synthesis and difference calculation with image data.

The storage unit 11 has a memory and can preserve not only reconstructed image data but also image data that have underwent the synthesis and difference calculation. The storage unit has a computer-readable recording medium (not shown), such as a memory, into which a multi-echo type of pulse sequence for MR imaging is recorded in the form of programs. This recording medium memorizes information about a pulse sequence according to the principle of the present invention, which have been described before. In the pulse sequence producing multi-echoes, an amount M' of the accumulated j-th (j=0, 1, 2, ... ) gradient moment down to the n-th (n=1, 2, 3, ... ) echo is set to approximately half of an amount M of the j-th gradient moment from the k-th to "k+1"-th echoes (M is substantially constant when $k \geq n$).

The display unit 12 displays an image. The input unit 13 is used by an operator to provide the host computer 6 with desired imaging conditions, a pulse sequence, and information about image synthesis and difference calculation.

Furthermore, the electrocardiographing components comprises an ECG sensor 17 attached to a patient body to detect an electric ECG signal and an ECG unit 18 performing various processes including digitization with the detected ECG signal and sending it to both the host computer 6 and the sequencer 5. This measured signal is used by the sequencer 5 to perform an imaging scan. This enables an appropriate determination of synchronous timing on an ECG-gating (electrocardiographing synchronization) technique, whereby an imaging scan on the ECG-gating technique using the determined synchronization timing can be performed to acquire data.

FIRST EMBODIMENT

An imaging technique according to a first embodiment of the present invention will now be described with reference to FIGS. 8 to 10, which is practiced on the VIPS method through the foregoing MRI system. This embodiment is reduced to various modes as follows.

Mode 1:

A mode 1 practices the imaging technique on the VIPS method with a DIET (Dual Interval Echo Train) method. That is, to adjust an amount ø' of the initial phase shift for an initial echo, the DIET method is used.

The DIET method is known by Japanese Patent Laid-open Publication No. 7-155309 and a paper "H. Kanazawa et al., Contrast Neutralization of Fast Spin Echo Imaging: A Fat Reduction Technique Free from Field Inhomogeneity, $2^{nd}$ SMR Scientific Program, p.486, 1994/8," of which one mode is that in a pulse sequence on the FSE method, an interval between the application of a 90-degree RF pulse and the acquisition of the first echo is set to odd times of three or more an interval between adjacent two echoes. A practical example is that a time integral amount of the readout gradient applied after the application of a 90-degree RF pulse and the acquisition of the first echo is odd times of three or more a time integral amount of the readout gradient applied between adjacent two echoes appearing after the first one.

Figure 1A:
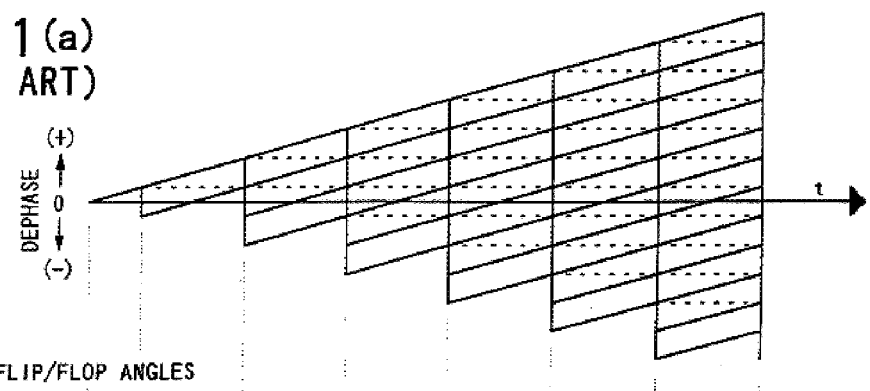
FIGS. 1(a) and (b) show illustrations of both a pulse sequence according to an ordinary FSE method, employed as a conventional example, and a phase diagram thereof.
Figure 1B:
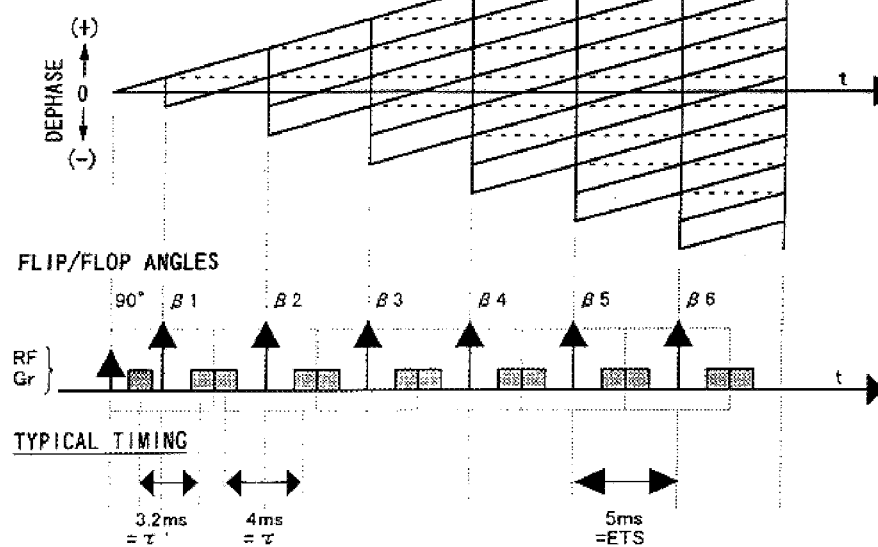
Figure 2:
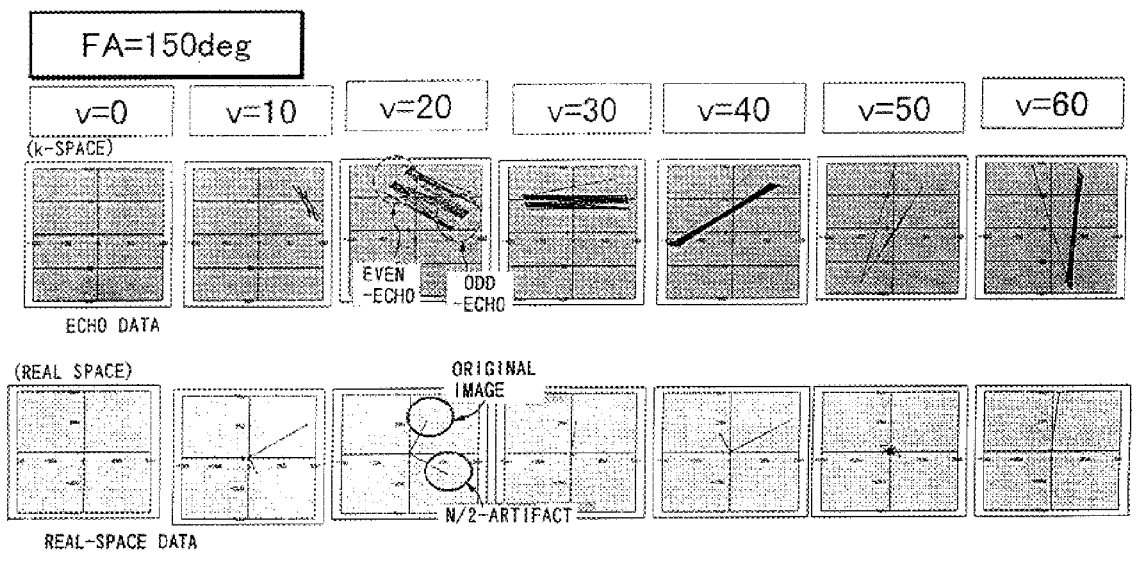
FIG. 2 illustrates examples of simulated calculation of echo signals (the velocity dependency of intensities of signal phases)
Figure 3:
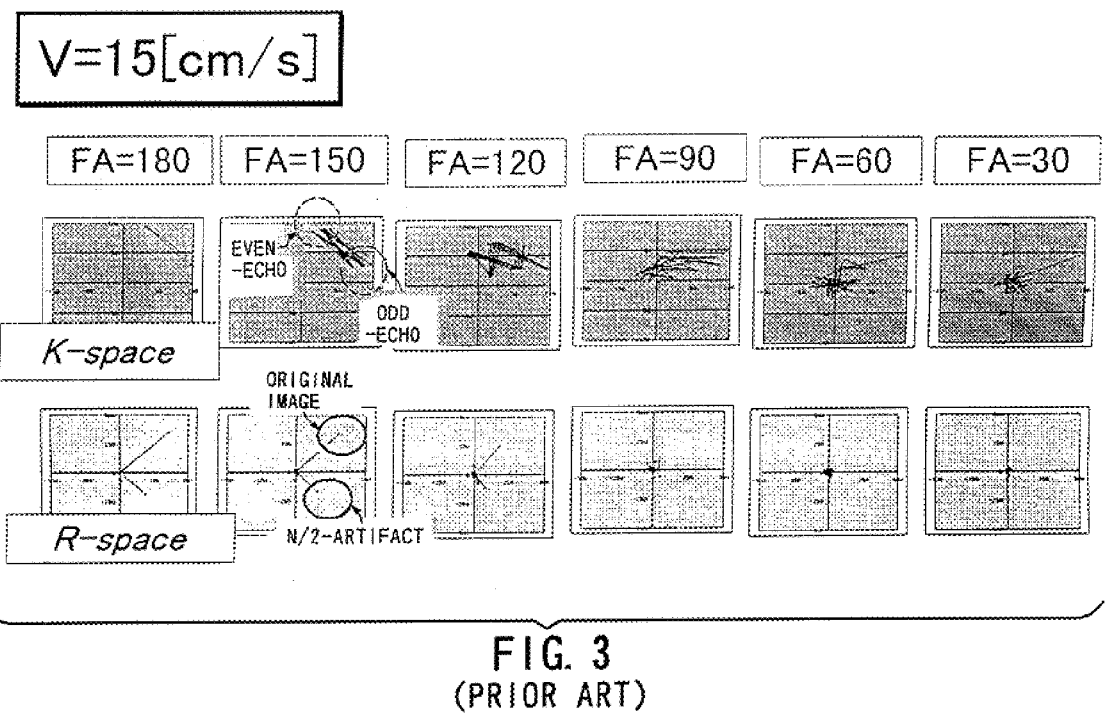
FIG. 3 illustrates examples of simulated calculation of echo signals (the flop angle dependency of intensities of signal phases)
Figure 4:
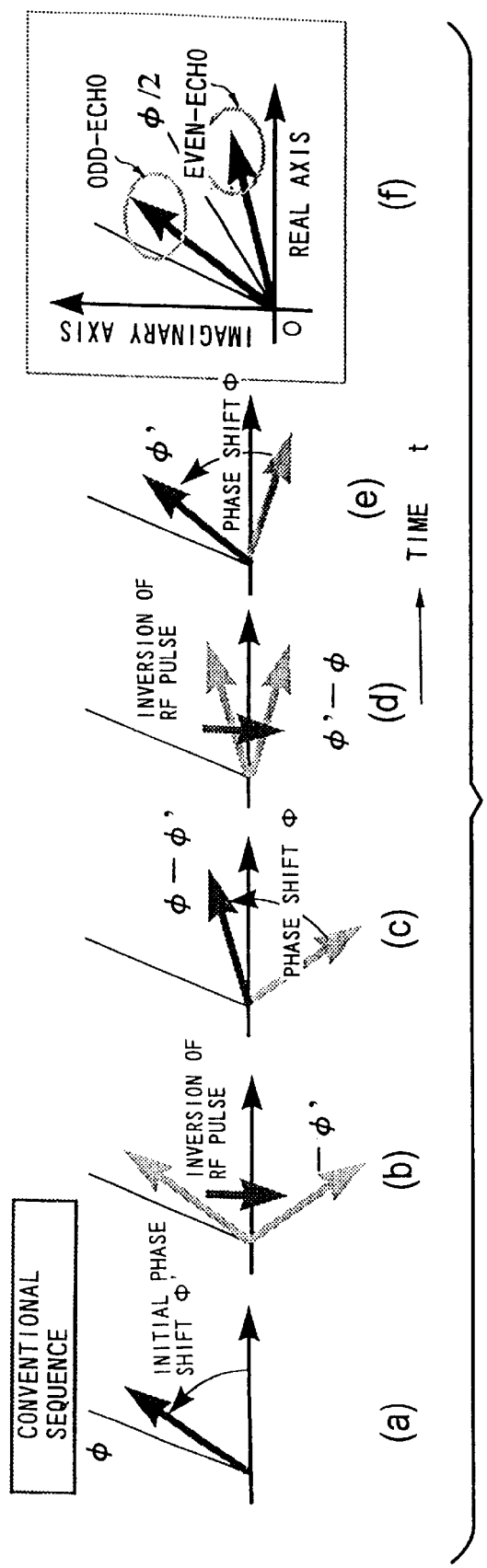
FIGS. 4(a)–(f) pictorially show phase shift states for multi-spin echoes according to the conventional method.
Figure 5:
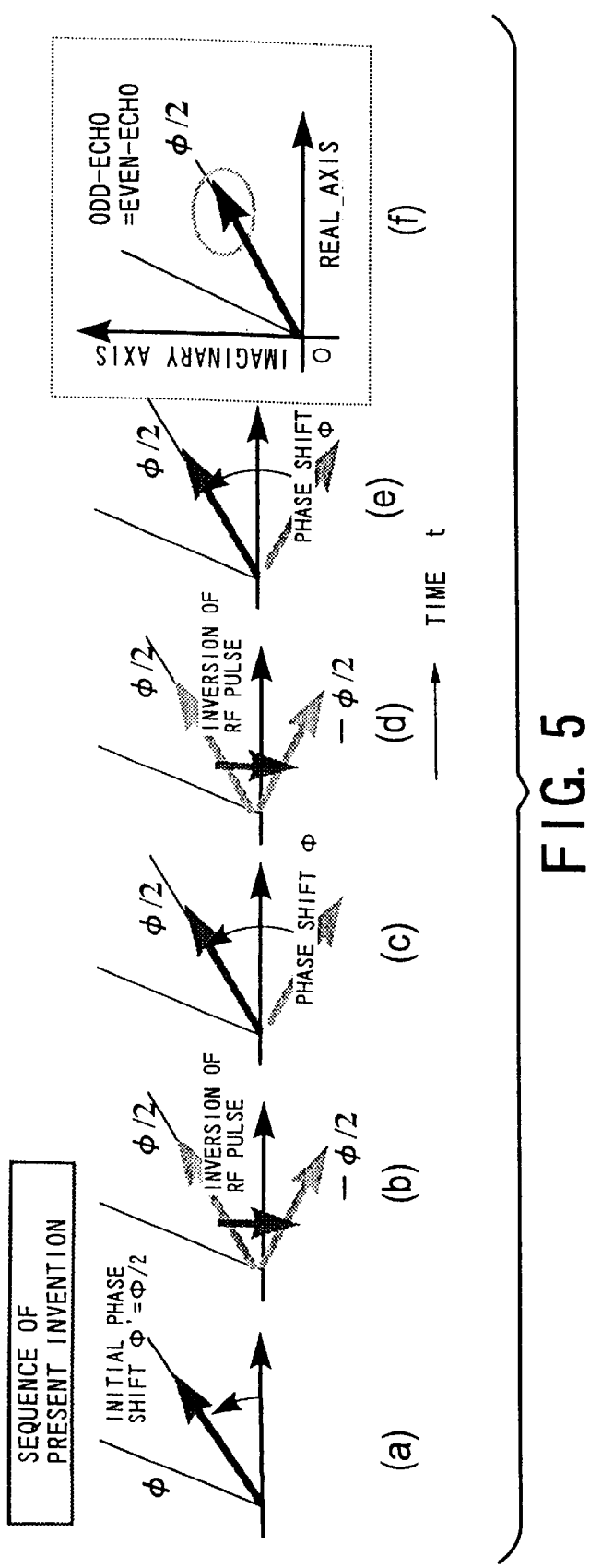
FIGS. 5(a)–(f) pictorially show phase shift states for multi-spin echoes according to the present invention.
Figure 8:
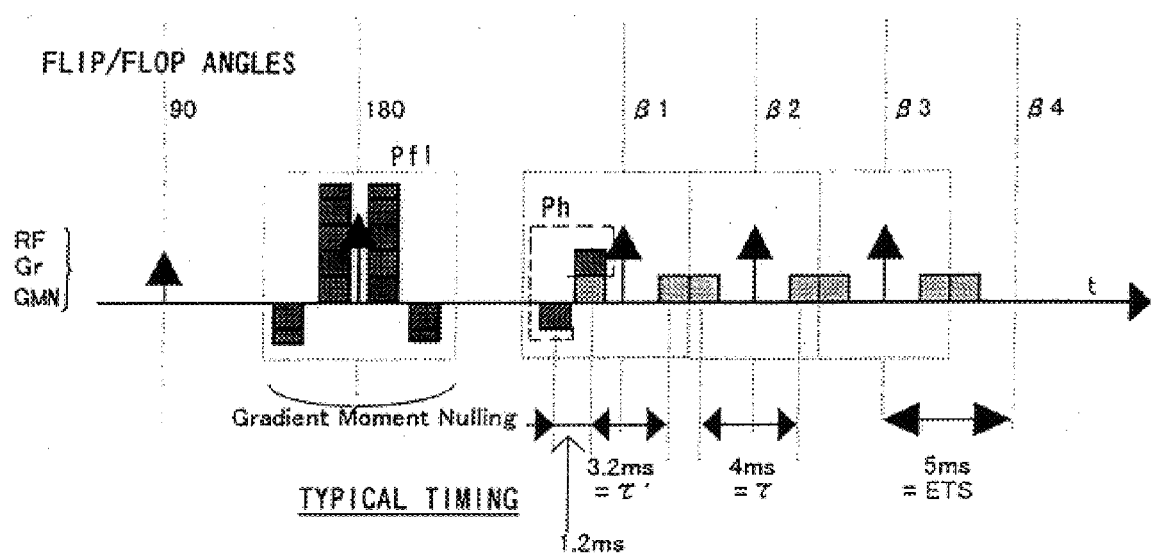
FIG. 8 is, as modes 1 and 2 of a first embodiment, a pulse sequence of which readout gradient pulse train is based on the DIET method and adopts the present invention.

FIG. 8 shows a pulse sequence of the mode 1. Likewise FIG. 1, this sequence is illustrated about the readout gradient, where gradients in the slice and readout directions are applied through known manners. This sequence is pictorially shown on the assumption that the rise is sufficiently fast, and the rise time is as small value as available in actual applications. Pulse sequence information on this pulse sequence is handed from the host computer 6 to the sequencer 5. In accordance with the sequence, the sequencer 5 operatively controls the units such as the gradient power supply 4, transmitter 8T, and others.

As understood from the figure, with the first flop pulse Pf1 intervening therebetween, a 1-3-3-1 type of waveform satisfying the second GMN is added to the sequence in a manner such that a condition for the gradient areas is met to the DIET method. This addition compensates for the phase shift resulted from velocities of flows such as blood flows. Moreover, a gradient pulse Ph for "half GMN" is added at immediately before an echo to be generated first so that the initial phase shift ø' becomes half of a phase shift amount ø repeatedly accumulated after that.

This way of providing the gradient is only an example; a variety of variations that permit alteration in the gradient waveform can be employed as long as the general condition for the FSE method, the area condition of the gradients for the DIET method, and the foregoing "ø/2" condition are met. A DIET factor deciding the first echo spacing in the DIET method can be set to various values as well.

Mode 2:

The present mode concerns a variation of imaging depending on the VIPS method on the basis of the above DIET method.

In the foregoing mode 1 shown in FIG. 8, the flop angle of the first flop pulse Pf1 is set to 180 degrees or thereabout. This is able to suppress longitudinal path components until the first echo is formed, effectively realizing an original goal in the DIET method.

As a further variation, utilizing a temporal margin until the first echo is formed in this DIET method allows its characteristic to be improved. If the first flop pulse Pf1 is formed of a SINC waveform, elongating its cut time can accomplish such a characteristic improvement. Alternatively, the first flop pulse Pf1 can be replaced by another optimum-designed refocusing RF pulse.

Mode 3

A mode 3 is concerned with an imaging method that adopts a pulse sequence in which the repetition of application patterns of gradients for repeatedly generating a few echoes to be generated for the first time in the ordinary FSE method is designed on the VIPS method of the present invention. Although this imaging is very simple, but provides a novel imaging method.

As described before, the pulse sequence based on the ordinary FSE method has repeatedly used a fundamental form in which a pulse train applied after the first flop pulse is neatly adjusted in spacing. By contrast, the imaging method according to this mode is set such that the fundamental form of repeated patterns for a few echoes to be generated for the first time is deformed to utilize deviations of a gradient resulting from its asymmetry for adjustment of the initial phase shift amount ø'.

Figure 9A:
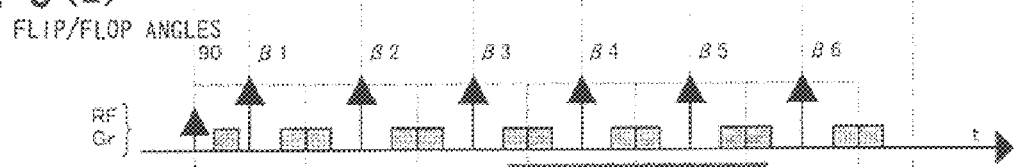
FIGS. 9(a)–(c) show, as a mode 3 of the first embodiment, pulse sequences, which are shown with an ordinary FSE-method based sequence, each of which readout gradient represents a changed manner of application timing into which the present invention is applied.
Figure 9B:
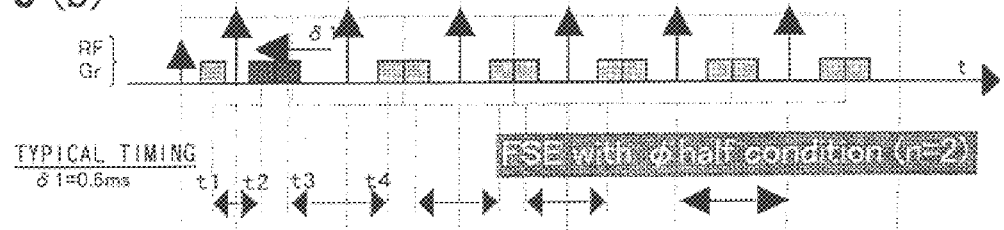
Figure 9C:
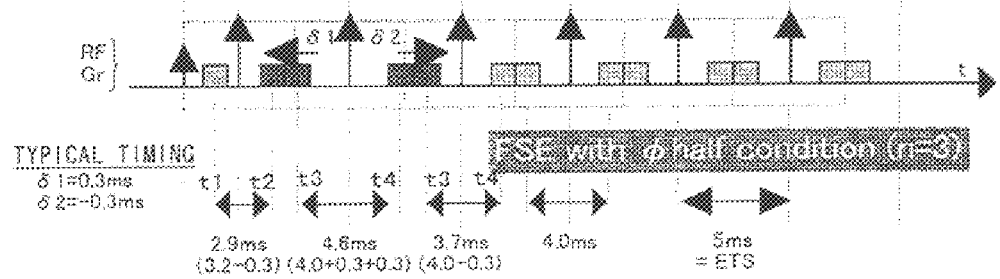

In FIG. 9(b) and (c), a readout gradient is exemplified and its pulse sequence of the present mode is exemplified. FIG. 9(a), which is drawn for comparison, provides a train of pulses on the ordinary FSE method. The examples in FIG. 9 show pulse trains whose application timing of the readout gradients Gr are simply shifted, where the flip angle=90 degrees represents a flip pulse and flop angles=β1 to β6 do the flop pulses. The present method is particularly well suited to the readout gradient.

In case that an echo train spacing ETS=5 [ms] is set, it is enough that only the first echo, that is, n=2, is used as echoes for adjusting an initial phase shift amount ø'. In the pulse sequence model shown in (b) of this figure, an adjusting time amount δ1 advancing the application of the first readout gradient pulse is set to 61=0.6 [ms], by way of example. This amount is available even in practical applications without any difficulties. The first echo is not used for reconstructing images and discarded. At the slight sacrifice, which scarcely affect image reconstruction, that "the first echo is made to concentrate on the adjustment of the phase shift and not used for image reconstruction," the "ø/2", condition can be satisfied.

As the example shown in (c) of the figure, in the case of n=3 that requires the first and second echoes as echoes used for the adjustment of an initial phase shift amount ø', one adjusting time amount δ1 advancing the application of the first readout gradient pulse is set to δ1=0.3 [ms] and the other adjusting time amount δ2 delaying that of the second one is set to δ2=−0.3 [ms]. In this case, the first and second echoes are discarded, not involved in image reconstruction.

Likewise, for any numbers of n=4 or more, the above temporal shift is performed to adjust a phase amount, leading to the satisfaction of the "ø/2" condition.

A general expression obtained when the temporal shift is adopted is shown as follows. Assumption is made such that the fundamental form on the FSE method is given and application timing of a readout gradient for the j-th echo is shifted by an amount of δj (the forward direction along the time axis is expressed by the plus sign). In this case, as long as an expression of:

$$\sum_{j=1}^{n-1}(-1)(j-1)\times \delta j = (\tau' - (\tau/2))/2$$

is realized, without using the Diet method, the "ø, /2", condition is met at the n-th echo in a pulse sequence on the ordinary FSE method. n is the echo number. τ' is a temporal difference between one instant t1 at the gravity of a readout gradient waveform applied between the flip and the flop, and another instant t2 at which a gravity of the readout gradient waveform for producing the first echo is achieved in its portion from the start of its application to the center of an echo. Additionally, τ is a temporal difference between one instant t3 at which the gravity of a readout gradient waveform for producing the k-th echo is achieved in its portion from the center of an echo to the end of its application, and another instant t4 at which the gravity of a gradient waveform for producing the "k+1"-th echo is achieved in its portion from the start of its application to the center of another echo.

In the above, exemplified has been a mode in which the "ø/2" condition is fulfilled by shifting a gradient waveform along the time axis direction from that of the ordinary FSE sequence taken as a reference. Alternatively, the waveforms itself may be changed so that gradient waveforms are shifted to the same position. For instance, if the readout gradient Gr is applied for 2 [ms] from an instant t0 [ms] at an intensity of G [mT/m], shifting the gradient waveform forward in the time basis by 0.5 [ms] is equivalent to its application from the instant t0 for 1 [ms] at an intensity of 2G [mT/m] (as concerning the 0-th moment and first moment of a gradient). Thus various modifications are possible.

Mode 4:

This mode 4 shows an example where the present invention is practiced to a slice gradient Gs, instead of the foregoing readout gradient Gr. There is an advantage that the slice direction can be approached straighter than the slice direction.

Figure 10A:
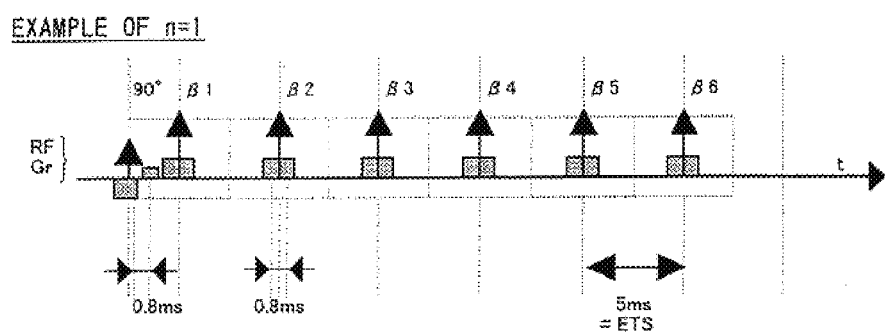
FIGS. 10A–B show, as a mode 4 of the first embodiment, pulse sequences whose slice gradients are changed in shape based on the present invention.
Figure 10B:
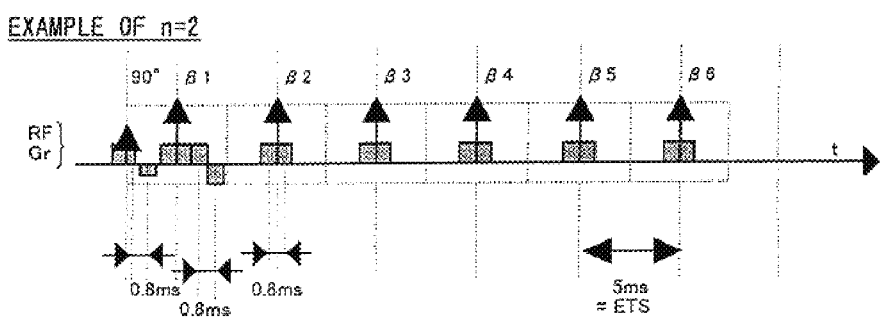

FIG. 10A illustrates an example (n=1) that fulfills the "/2" condition at the first echo, whilst FIG. 10B does another example (n=2) that realizes the "ø/2" condition at the second echo. In either pulse sequence, altering the shape of the slice gradient Gs applied in the ordinary FSE sequence satisfies the foregoing "ø/2" condition.

In the pulse sequence shown in FIG. 10A, a slice gradient pulse Gs to be superposed on a flip pulse of a flip angle FA=90 degrees is inverted, resulting in that the phase shift of spins is previously restored by the half before the generation of the first echo. In this mode, the slice gradient to be applied after the flip pulse is half the flop pulse. In the pulse sequence shown in FIG. 10B, because a phase shift which has been accumulated till the generation of the first echo is so large that the phase shift is restored so as to satisfy the "ø/2" condition before the second echo is generated.

As for the slice direction, although waveforms which can be realized may be provided when n=1, it must be necessary to either invert the gradient superposed in applying the flip pulse or make the waveform more complicated to call for a waveform shape of a larger intensity. Particularly, in the latter case, there occurs an unreasonable demand in a 3D scan that necessitates phase encoding in the slice direction. In the case of n=2 shown in FIG. 10B, if a premise that the first echo is not used for image reconstruction is given, a degree of freedom in design increases greatly. Only one example has been described in the above, but the imaging described in this mode can be realized on the VIPS method involving n of two or more, without encountering any unreasonable situation.

Mode 5:

This mode relates to producing an absolute value image.

In any of the foregoing modes or, in general, in an example performing a pulse sequence fulfilling the "ø/2" condition, pixels representing movement form a reconstructed image having phase shifts agreeing with velocities. Hence producing an absolute value image by a known calculation technique provides images in which movement of blood flows and others is enhanced.

It may be possible to have this absolute value image data calculated by the calculation unit 10.

Mode 6:

This mode 6 is concerned with an imaging technique referred to as a partial-Fourier method (or half-Fourier method).

In general, the partial-Fourier method is a technique that data toward plus and minus values of the phase encode in only lower frequency components are acquired, a phase distribution of the lower spatial frequency components is obtained, and an image is calculated with its direction adopted as a real part. Owing to the fact that the blood system has spatial frequency components ranging from medium to higher values, selected is an acquisition and reconstruction condition for the partial-Fourier method which is able to express frequency components up to a value as high as corresponding to a blood vessel to be scanned. For example, in cases where an FOV is determined as FOV=350 [mm] and an object to be depicted is set to the aorta abdominalis of 20 [mm] in diameter running in a readout direction, 350/20=17.5 is established and phase encodes at a minimum of ±9 lines are necessary in a central part of a k-space. If having margins, it is preferable to set phase encodes at, for example, some ±16 lines. However, in cases an object concentrates in suppressing artifacts emanating from flow portions, there are some cases that no particular problem occurs, because "N/2" artifacts are reduced, with signal intensities in portions where the phase shift is generated simply lowered.

Mode 7:

This mode concerns to the order of phase encoding under which data acquisition is made.

Figures 6A, 6B:
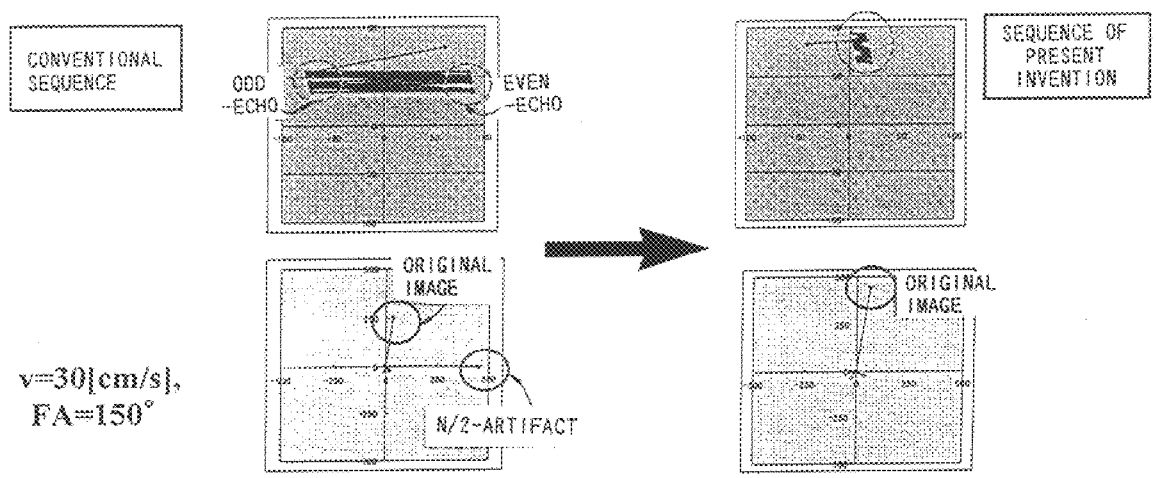
FIGS. 6(a)–(b) provide a calculation example showing an improved states concerning phase intensities of echo signals, thanks to a Ø/2 condition.

As described in FIG. 6, when satisfying the "ø/2" condition according to the fundamental principle of the present invention, the echo oscillation caused between the odd and even echoes can be suppressed, but the echoes are not necessarily stabilized completely due to influences from signals other than spin echoes. In this case, it is effective to additionally use a centric order technique that allows significant data mapped in a central part of the k-space to be acquired from echoes to be generated in the early stage.

For example, in single-shot type of data acquisition, the amounts of phase encoding are determined to perform the acquisition in the phase encoding order of 0, 1, –1, 2, –2, 3, –3 . . . , 127, –127, 128 after the n-th echo satisfying the "ø/2" condition. In case that the partial-Fourier method is used, it is possible to determine the order as, like the conventional one, –15, –14, . . . , –1, 0, 1, 2, . . . , 15, 16, 17, . . . , 127, 128, where the phase encoding amounts of –15 to 16 are assigned to imaging of lower frequency components; on one hand, the acquisition can be made in the order of 0, 1, –1, 2, –2, . . . , 15, –15, 16, 17, 18, 19, . . . , 127, 128, where the phase encoding amounts of –15 to 16 are used for imaging of lower frequency components.

Mode 8:

This mode involves imaging on the second or more moment (namely, not the velocity term, but higher order terms consisting of the acceleration term or more) of an object in motion.

The modes that have been described so far are based on imaging that uses differences in phase about the velocity term. Alternatively, when a sequence is determined so that the relationship of M'=M/2 is maintained as for the second moment, where that obtained until the n-th echo is M' and that obtained between echoes thereafter is M, on condition that the 0-th and first gradient moments are zero by applying to the sequence the first gradient moment nulling (GMN) method conventionally used, multi-echoes having a constant phase shift proportional to the acceleration components can be acquired.

A summary is that, when setting the 0-th to "j-1"-th gradient moments to zero and maintaining the relationship of M'=M/2 (as for the j-th moment, a moment value to be obtained until the n-th echo is M' and that obtained between echoes to be generated thereafter is M), multi-echoes of a certain phase shift proportional to the j-th positional variation can be acquired.

Mode 9:

This mode relates to imaging on the VIPS method that makes use of appropriate setting of delay times for an ECG-gating method involved in depicting blood flows.

As has already been reported, for depicting blood flows, the ECG-gating technique is additionally used, in which the scan start timing is appropriately delayed from, for example, R-waves, so that it make it possible to select a delayed temporal range for blood flows, providing an effective way to image blood flows.

Although the imaging on the VIPS method can control the entire phase shift within a voxel so that it becomes a constant, the spins dephase in the voxel. Therefore, appropriately setting the delay time enables data to be acquired when blood flows at a slower speed, improving depiction performance of blood vessels.

In place of the ECG gating, a peripheral gating technique can be used to perform imaging on the VIPS method.

Mode 10:

This mode involves imaging on the VIPS method practiced into gradient-refocusing type of multi-echo imaging.

In the gradient-refocusing type of multi-echo imaging represented by echo planar imaging the setting the foregoing initial phase shift amount ø' to ø/2, the echo shifts which will follow will the initial one are as follows.

$$\phi/2, -\phi/2, \phi/2, -\phi/2, \ldots$$

Differently from the multi-echo imaging that uses refocusing RF pulses (flop pulses), the phase shift does not converge to a certain value, but its absolute amount is minimized. Additionally, both the even and odd echoes dephase at an approximately identical rate, providing an advantage that errors are minimized.

SECOND EMBODIMENT

Referring to FIG. 11, a second embodiment of the present invention will now be described. This embodiment relates to imaging using a phase contrast method based on the FSE method.

In the FSE-system imaging, satisfying the "ø/2" condition causes a phase shift proportional to the product between a gradient moment and a velocity obtained between echoes which sequentially follows the n-th echo. Precisely, as both the gradient moment and velocity take vector quantities of three dimensions, phase shifts to be generated are proportional to their scalar products. Assume that gradient moments are M0' and M0 (M0'=M0/2) for a fundamental sequence, where M0 takes three-dimensional vector quantities. This fundamental sequence is shown in FIG. 11(a), and this sequence is referenced by S0.

As a velocity encoding gradient, there is provided a sequence shown in FIG. 11(b), which called A1, where its initial phase MA1' and its repeated phases MA1 are determined so that the relationship of MA1'=MA1/2 is maintained.

Adding the sequence A1 to the fundamental sequence S0 produces a sequence "S0+A1," which equals S1. This produced sequence S1 also fulfils the "ø/2" condition (i.e., the initial phase M1' and repeated phases M1 accomplish M1'= M1/2).

Between an image obtained from the sequence S0 and another image obtained from the sequence S1, there arises a difference in phase that is proportional to the scalar product between M0/2 and the velocity v. As a result, data corresponding to the known. phase contrast method can be acquired.

Like the sequence S1, providing sequence S1, S2, . . . , Sm makes it possible to have different moments M1, M2, . . . , Mm.

Mode 1:

In a mode 1 of the second embodiment, the most fundamental phase contrast (PC) method will be described.

How to set a moment that corresponds to this phase contrast method is any of the followings.

M1-M0 and M2-M0 are set as being two points that are symmetry about the origin. A direction of the moment is a readout direction, for example.

M1-M0 and M2-M0, and, M3-M0 and M4-M0 are set such that they, respectively, form two points symmetry about the origin and perpendicular to each other. Directions of the moment are a readout direction and a phase-encode direction, for example.

M1-M0 and M2-M0, M3-M0 and M4-M0, and M5-M0 and M6-M0 are set such that they, respectively, form two points symmetry about the origin and these three sets are mutually perpendicular. Directions of the moment are a readout direction, a phase-encode direction, and a slice direction, for example.

Mode 2:

This mode concerns a phase contrast method making use of a Hadamard's transform known as being a four-point method.

How to set a moment that corresponds to this phase contrast method is as follows.

M1-M0, M2-M0, M3-M0 and M4-M0 are sequentially set, as being moments in a readout direction, phase-encode direction, and slice direction, so as to have values of $(\mu, \mu, \mu)$, $(\mu, -\mu, -\mu)$, $(-\mu, \mu, -\mu)$, $(-\mu, -\mu, \mu)$, where $\mu$ is a constant.

Mode 3:

This mode is concerned with a mode where the gradient moment nulling technique is used together.

There is provided a construction where the gradient moment nulling is included in the above-mentioned sequence S0. This sequence has a limitation in shortening the echo train spacing, but is able to increase measurement accuracy for relatively slower blood flows. In such a case, the gradient moment M0 becomes zero due to nulling, the foregoing descriptions are expressed as any of the followings, respectively.

M1 and M2 are set as being two points that are symmetry about the origin. A direction of the moment is a readout direction, for example.

M1 and M2, and, M3 and M4 are set such that they, respectively, form two points symmetry about the origin and perpendicular to each other. Directions of the moment are a readout direction and a phase-encode direction, for example.

M1 and M2, M3 and M4, and M5 and M6 are set such that they, respectively, form two points symmetry about the origin and these three sets are mutually perpendicular. Directions of the moment are a readout direction, a phase-encode direction, and a slice direction, for example.

M1, M2, M3 and M4 are sequentially set, as being moments in a readout direction, phase-encode direction, and slice direction, so as to have values of $(\mu, \mu, \mu)$, $(\mu, -\mu, -\mu)$, $(-\mu, \mu, -\mu)$, $(-\mu, -\mu, \mu)$, where $\mu$ is a constant.

THIRD EMBODIMENT

Figure 12:
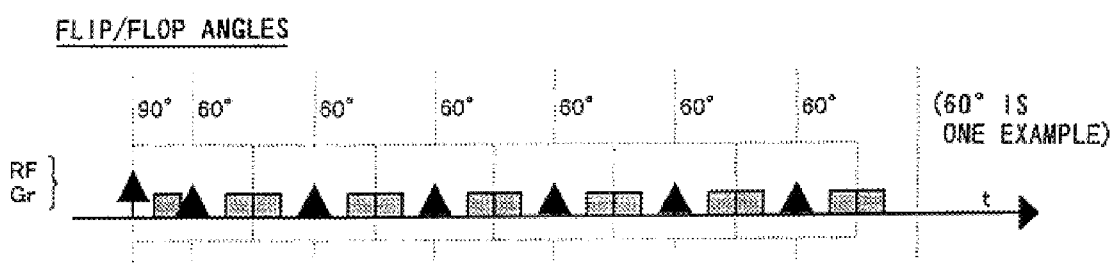
FIG. 12 is an illustration for a pulse sequence in compliance with a lower-flop angle type of FSE method, according to a third embodiment of the present invention.

A third embodiment of the present invention will be shown in FIG. 12. This embodiment involves blood flow imaging known as lower-flop type of black blood imaging.

Differently from the imaging methods according to the first and second embodiments, the imaging method in this embodiment provides a black blood imaging method that allows signals from blood flows to diminish almost completely.

As shown in FIG. 12, performing data acquisition through a pulse sequence based on an FSE method using a lower flop angle (for example, 90 degrees or less) remarkably decrease a depiction performance for blood flow signals. The third embodiment is derived from this fact, where in multi-echo imaging using refocusing RF pulses (flop pulses), their flop angles are assigned to a lower flop angle (for example, 90 degrees or less) that is unusable for the ordinary FSE imaging. A construction is such that information on this pulse sequence is sent to the sequencer 5 from the host computer 6. This makes it possible to carry out blood flow imaging on the black blood technique.

As described above, by the MR imaging method and MRI system of the present embodiments, the "N/2" ghosts and signal decay can be suppressed greatly, which occur from objects in motion, such as blood flows, as long as the multi-echo method is used. Thus the imaging will be performed in a stable manner. In particular, blood flow images for large blood vessel systems are obtained stably, without using contrast mediums, in addition to lowering ghost artifacts due to flows, which will appear in the ordinary imaging.

The present invention is not restricted to the constructions shown in the foregoing embodiments, but a person having ordinary skill in the art can create a variety of constructions adequately altered or deformed within the scope of the claims. For instance, fluids in motion that are objects to be imaged by the present invention is not confined to blood flows; fluids that are in motion within a subject to be examined, for example, cerebral spinal fluid (CSF) is included.

I claim:

1. An MR imaging method comprising the steps of:
    performing a pulse sequence including an excitation pulse exciting spins of an object to be imaged, a plurality of pulses generating a plurality of echoes by inverting the excited spins a plurality of times, and a gradient pulse set such that a gradient moment to be accumulated before a generation time to be referenced of a given echo selected from the plurality of echoes is substantially half a gradient moment accumulated between echoes generated after the generation time;
    acquiring the plurality of echoes generated in response to the performance of the pulse sequence; and
    producing an MR image by using at least part of echoes included in the acquired plurality of echoes and generated after the given echo.

2. An MR imaging method of claim 1, wherein the performing step is a step performed with the gradient pulse set such that, among the plurality of echoes, an amount M' of a j-th (j=1, 1, 2, . . . ) gradient moment accumulated up to an n-th (n=1, 2, 3,. . . ) echo is approximately half an amount M (considered to be approximately constant when k≧n) of a j-th gradient moment from a k-th (k=n, n+1, n+2, . . . ) echo to a "k+1"-th echo.

3. An MR imaging method of claim 2, wherein the j-th gradient moment is a velocity moment corresponding to j=1.

4. An MR imaging method of claim 2, wherein the MR image is produced using all echoes generated after the n-th echo in the plurality of echoes.

5. An MR imaging method of claim 1, wherein the pulse sequence is a pulse sequence that causes multi-echoes to be generated in response to application of a plurality of refocusing pulses.

6. An MR imaging method of claim 5, wherein the j-th gradient moment is a velocity moment corresponding to j=1.

7. An MR imaging method of claim 5, wherein, as the multi-echo type of pulse sequence that uses the refocusing pulses, an pulse sequence on a fast SE method that allows all indirect echoes to be included and superposed.

8. An MR imaging method of claim 7, wherein the pulse sequence is a single shot type of pulse sequence.

9. An MR imaging method of claim 2, wherein the n-th echo of the pulse sequence is an echo for n≧2 and the gradient pulse applied until the "n−1" -th echo in order to set the gradient moment is changed about either one of time and amplitude thereof.

10. An MR imaging method of claim 9, wherein the gradient pulse is a readout gradient pulse.

11. An MR imaging method of claim 10, wherein the readout gradient pulse applied at the first echo to the "n−1"-th echo of the pulse sequence on the fast SE method is a gradient pulse applied shifted in time, where the gradient pulse is set to be shifted in a time axis direction such that an amount of the shifted time becomes a desired value with signs given the shifted time in accordance with the number of inversions of a refocusing pulse.

12. An MR imaging method of claim 7, wherein the pulse sequence is a pulse sequence on the basis of a DIET (Dual Interval Echo Train) method.

13. An MR imaging method of claim 12, wherein the pulse sequence on the DIET method is a pulse sequence in which gradient moment nulling is performed before and after a refocusing pulse to be applied in a first echo train spacing to be anticipated and the condition for setting the gradient moment is satisfied immediately before a first echo.

14. An MR imaging method of claim 1, wherein the pulse sequence is a sequence set in an order on a centric order technique where an order of phase encoding applied to the echoes is oriented from a central part in a phase encode direction of a k-space to a peripheral part thereof in the k-space.

15. An MR imaging method of claim 1, wherein the pulse sequence is a pulse sequence on the basis of a partial-Fourier method.

16. An MR imaging method of claim 1, wherein the pulse sequence is performed using either one of an electrocardiograph gating technique and a peripheral gating technique.

17. An MR imaging method of claim 16, wherein either one of the electrocardiograph gating technique and the peripheral gating technique is set to perform a delay time control in a manner that the pulse sequence is executed at a temporal phase in which a flow velocity in a blood vessel employed as the object is relatively smaller.

18. An MR imaging method for obtaining an MR image of an object that flows, by using a multi-echo type of pulse sequence, comprising the steps of:
    producing the pulse sequence by setting a gradient pulse such that, among the plurality of echoes, an amount M' of a j-th (j=1, 1, 2, . . . ) gradient moment accumulated up to an n-th (n=1, 2, 3, . . . ) echo is approximately half an amount M (considered to be approximately constant when k≧n) of the j-th gradient moment from a k-th (k=n, n+1, n+2, . . . ) echo to a "k+1"-th echo; and
    performing the pulse sequence.

19. An MRI system comprising:
    means for performing a pulse sequence including an excitation pulse exciting spins of an object to be imaged, a plurality of pulses generating a plurality of echoes by inverting the excited spins a plurality of times, and a gradient pulse set such that a gradient moment to be accumulated before a generation time to be referenced of a given echo selected from the plurality of echoes is substantially half a gradient moment accumulated between echoes generated after the generation time;

means for acquiring the plurality of echoes generated in response to the performance of the pulse sequence; and means for producing an MR image by using at least part of echoes included in the acquired plurality of echoes and generated after the given echo.

20. An MRI system of claim 19, wherein the pulse sequence is a pulse sequence in which, among the plurality of echoes, an amount M' of a j-th (j=1, 1, 2, ...) gradient moment accumulated up to an n-th (n=1, 2, 3, ...) echo is approximately half an amount M (considered to be approximately constant when k≧n) of a j-th gradient moment from a k-th (k=n, n+1, n+2, ...) echo to a "k+1"-th echo.

21. A computer-readable recording medium in which a multi-echo type of pulse sequence for MR imaging is recorded in the form of a program, wherein the pulse sequence is a pulse sequence in which, among the plurality of echoes, an amount M' of a j-th (j=1, 1, 2, ...) gradient moment accumulated up to an n-th (n=1, 2, 3, ...) echo is approximately half an amount M (considered to be approximately constant when k≧n) of a j-th gradient moment from a k-th (k=n, n+1, n+2, ...) echo to a "k+1"-th echo.

22. An MR imaging method for obtaining an MR image of an object that flows, by using a multi-echo type of pulse sequence including a plurality of refocusing RF pulses, comprising the steps of:

performing, under m-piece (m is plural) gradient moments M (M1, M2, ..., Mm) to be applied, the pulse sequence set such that, among the plurality of echoes, an amount M' of a j-th (j=1, 1, 2, ...) gradient moment accumulated up to an n-th (n=1, 2, 3, ...) echo is approximately half an amount M (considered to be approximately constant when k≧n) of the j-th gradient moment from a k-th (k=n, n+1, n+2, ...) echo to a "k+1"-th echo;

acquiring the multi-echoes emanated in response to the performance; and imaging j-th information of the object from a plurality of sets of MR data in association with the acquired multi-echoes.

23. An MR imaging method of claim 22, wherein the m-piece gradient moments have an amount representing a difference from a desired gradient moment M0 associated with a phase contrast method.

24. An MR imaging method of claim 23, wherein the desired gradient moment M0 is set such that M0=0 to when performing gradient moment nulling.

25. An MRI system for obtaining an MR image of an object that flows, by using a multi-echo type of pulse sequence including a plurality of refocusing RF pulses, comprising:

means for performing, under m-piece (m is plural) gradient moments M (M1, M2, ..., Mm) to be applied, the pulse sequence set such that, among the plurality of echoes, an amount M' of a j-th (j=1, 1, 2, ...) gradient moment accumulated up to an n-th (n=1, 2, 3, ...) echo is approximately half an amount M (considered to be approximately constant when k≧n) of the j-th gradient moment from a k-th (k=n, n+1, n+2, ...) echo to a "k+1"-th echo;

means for acquiring the multi-echoes emanated in response to the performance; and means for imaging j-th information of the object from a plurality of sets of MR data in association with the acquired multi-echoes.

26. An MR imaging method for obtaining an MR image of an object by using a multi-echo type of pulse sequence including a plurality of refocusing,RF pulses, wherein a flop angle that the plurality of refocusing pulses provide a magnetization spin is set to be a smaller value of 90 degrees or less.

27. An MR imaging method of claim 26, wherein, as the multi-echo type of pulse sequence using the refocusing pulses, a pulse sequence on a fast SE method by which indirect echoes are superposed on the echoes is used.

* * * * *